(12) United States Patent
Wu et al.

(10) Patent No.: US 11,101,403 B1
(45) Date of Patent: Aug. 24, 2021

(54) SURFACE LIGHT SOURCE

(71) Applicant: Shenzhen Xiangyou Technology Co., LTD, Shenzhen (CN)

(72) Inventors: Yuping Wu, Kowloon (HK); Yue Liu, Kowloon (HK)

(73) Assignee: SHENZHEN XIANGYOU TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 16/817,800

(22) Filed: Mar. 13, 2020

(51) Int. Cl.
| | |
|---|---|
| *H01L 33/06* | (2010.01) |
| *H01L 33/32* | (2010.01) |
| *H01L 33/34* | (2010.01) |
| *H01L 33/10* | (2010.01) |
| *H01L 33/52* | (2010.01) |

(52) U.S. Cl.
CPC .............. *H01L 33/06* (2013.01); *H01L 33/10* (2013.01); *H01L 33/32* (2013.01); *H01L 33/34* (2013.01); *H01L 33/52* (2013.01)

(58) Field of Classification Search
CPC ......... H01L 33/06; H01L 33/10; H01L 33/32; H01L 33/34; H01L 33/52
See application file for complete search history.

(56) References Cited

U.S. PATENT DOCUMENTS

| | | | |
|---|---|---|---|
| 9,334,442 B2 * | 5/2016 | Greuel ................ | C09K 11/025 |
| 10,578,257 B2 * | 3/2020 | Koole ................. | C09K 11/883 |
| 2011/0304264 A1 * | 12/2011 | Winkler ............. | C09K 11/7734 313/504 |
| 2017/0276300 A1 * | 9/2017 | Koole .................... | F21V 29/70 |

* cited by examiner

*Primary Examiner* — Mark W Tornow
(74) *Attorney, Agent, or Firm* — WPAT, PC

(57) ABSTRACT

A surface light source includes a light emitting unit and an optical plate. The optical plate has a light input surface and a light output surface. A side of the optical plate where the light input surface is located have grooves arranged thereon and spaced from one another. A quantum layer is arranged in each of the grooves and includes a colloid and multiple quantum dot nanostructures dispersed in the colloid. Each the quantum dot nanostructure includes an inner core, a ligand layer, a hydrophobic layer, an encapsulation layer and a barrier layer. The light emitting unit includes light sources respectively arranged in the grooves, and a light emitting surface of each the light source is close to the quantum layer so that at least a part of the light rays emitted from the light source is struck onto the quantum layer.

10 Claims, 3 Drawing Sheets

B-B

SURFACE LIGHT SOURCE

FIELD OF THE DISCLOSURE

The disclosure relates to the technical field of light source, and in particular to a surface light source.

BACKGROUND OF THE DISCLOSURE

Nowadays, higher and higher requirements are required for a surface light source module. On the one hand, it is required to emit light evenly and have a good color gamut; on the other hand, it is required to be thin and light enough. At present, a common method is to place a dot matrix composed of LEDs on a bottom surface of an outer frame of the surface light module, with a light emitting surface of the surface light module facing a diffusion plate. The diffusion plate diffuses light, thus an LED point light source is changed into a relatively uniform surface light source. However, in order to obtain an uniform visual effect, it is necessary to increase a density of the LED dot matrix or increase a space between diffuser plate and each LED. As a result, a thickness of surface light source module will be increased, which is not capable of facilitating thinning of a display screen. Moreover, a color gamut level of the surface light source obtained by the above structure is not ideal and still needs to be improved.

SUMMARY OF THE DISCLOSURE

The disclosure provides a surface light source, for solving the non-ideal color gamut level of the surface light source mentioned above.

Specifically, a surface light source is provided by an embodiment of the disclosure. The surface light source comprises: an optical plate, a reflective layer, a quantum layer, and a light emitting unit. The optical plate has a light input surface and a light output surface, the light input surface and the light output surface are positioned on two adjacent sides of the optical plate respectively; and the side of the optical plate where the light input surface is positioned has grooves arranged thereon and spaced from one another. The reflective layer is disposed in each of the grooves of the optical plate. The quantum layer is arranged in each of the grooves of the optical plate and positioned on a side of the reflective layer facing away from the light input surface. The quantum layer and a side wall of each of the grooves have a gap existed therebetween. The quantum layer comprises a colloid and a plurality of quantum dot nanostructures dispersed in the colloid. Each of the plurality of quantum dot nanostructures comprises an inner core, a ligand layer, a hydrophobic layer, an encapsulation layer and a barrier layer. The ligand layer covers the inner core, the hydrophobic layer is arranged on a side of the ligand layer facing away the inner core, the encapsulation layer is arranged on a side of the hydrophobic layer facing away the ligand layer, and the barrier layer comprises a plurality of stacked microsphere structures arranged on a side of the encapsulation layer facing away the hydrophobic layer. The light emitting unit comprises light sources. The light sources are arranged in the grooves, and a light emitting surface of each of the light sources is close to the quantum layer so that at least a part of light rays emitted from the light source is capable of being striking onto the quantum layer.

In addition, a surface light source is provided by an embodiment of the disclosure. The surface light source comprises a light emitting unit and an optical plate, wherein the optical plate comprises a light input surface and a light output surface, and the light input surface and the light output surface are positioned on two adjacent sides of the optical plate respectively, and the side of the optical plate where the light input surface is positioned has grooves arranged thereon and spaced from one another; wherein a quantum layer is arranged in each of the grooves, the quantum layer comprises a colloid and a plurality of quantum dot nanostructures dispersed in the colloid; each of the plurality of the quantum dot nanostructure comprises an inner core, a ligand layer, a hydrophobic layer, an encapsulation layer and a barrier layer; the ligand layer covers the inner core, the hydrophobic layer is arranged on a side of the ligand layer facing away the inner core, the encapsulation layer is arranged on a side of the hydrophobic layer facing away the ligand layer, and the barrier layer is arranged on a side of the encapsulation layer facing away the hydrophobic layer; wherein the light emitting unit comprises light sources, wherein the light sources are arranged in the grooves respectively, and a light emitting surface of each of the light sources is close to the quantum layer so that at least a part of light rays emitted from the light source is capable of being striking onto the quantum layer.

In an embodiment of the disclosure, the surface light source includes a reflective layer disposed in the groove of the optical plate; the quantum layer is arranged in the groove of the optical plate and is positioned on a side of the reflective layer facing away the light input surface.

In an embodiment of the disclosure, the quantum layer and a side wall of each of the grooves has a gap existed therebetween.

In an embodiment of the disclosure, each of the light sources is a light emitting diode.

In an embodiment of the disclosure, the colloid is made of a material being one selected from a group consisting of an epoxy resin, a silicone resin, a polycarbonate, a polyvinyl chloride, a polystyrene and a polymethyl methacrylate.

In an embodiment of the disclosure, a width of the gap is in a range of 5-15 microns.

In an embodiment of the disclosure, the barrier layer is a multi-layer structure, and materials of layers in the multi-layer structure are different.

In an embodiment of the disclosure, the barrier layer comprises a plurality of stacked microsphere structures, and a gap exists between each adjacent two of the stacked microsphere structures and forms a blind hole of the barrier layer.

In an embodiment of the disclosure, the barrier layer is made of a material being one of a silicon and a metal oxide; and the metal oxide is one of an aluminum oxide, a titanium oxide, a strontium titanate and a barium titanate.

In an embodiment of the disclosure, the inner core is made of a material being one of a II-VI group quantum dot, a III-V group quantum dot, a II-VI group quantum dot having a shell-core structure, a III-V group quantum dot having a shell-core structure, a non-spherical II-VI group quantum dot having an alloy structure, and combinations of any two or more thereof.

The technical solutions of the disclosure can have one or more beneficial effects as follows. In a respect, since the quantum layer is arranged in the optical plate, the quantum dot nanostructure in the quantum layer can emit light with a specific wavelength under the irradiation of the light emitting unit, therefore a color gamut level of the optical module is increased and color expression of the display panel is improved. In another respect, since the quantum layer is located in the groove of the optical plate, a thickness and a volume of the optical plate are not increased, and it is beneficial for thinning and miniaturization design of the optical plate. In a further respect, since there is a gap between the quantum layer and the side wall of the groove, an optical coupling effect between the quantum dot nanostructure and the optical plate can be improved, thus a color gamut level of light rays emitted from the optical plate can be significantly improved; In a yet further respect, since the reflective layer is arranged in the groove and the quantum layer is arranged on the reflective layer, the emitted light can be more uniform; In an addition, since the barrier layer is formed of a plurality of microsphere structures stacked and blind holes exist in the barrier layer, light emission uniformity can be improved thereby.

BRIEF DESCRIPTION OF THE DRAWINGS

In order to explain technical solutions of the disclosure more clearly, drawings needed to be used in the description of embodiments will be briefly introduced hereinafter. It is clear that the drawings in the following description are just some embodiments of the disclosure, and other drawings can be obtained by a person of ordinary skill in the art according to the drawings, without creative labor.

DETAILED DESCRIPTION OF EMBODIMENTS

The technical solutions in the embodiments of the disclosure will be described clearly and completely hereinafter with reference to the drawings in the embodiment of the disclosure. It is clear that the described embodiments are only a part of embodiments of the disclosure, not all of the embodiments of the present disclosure. Based on the embodiments of the disclosure, other embodiments obtained by the person of ordinary skill in the art without creative labor all fall within the scope of the disclosure.

Figure 1A:
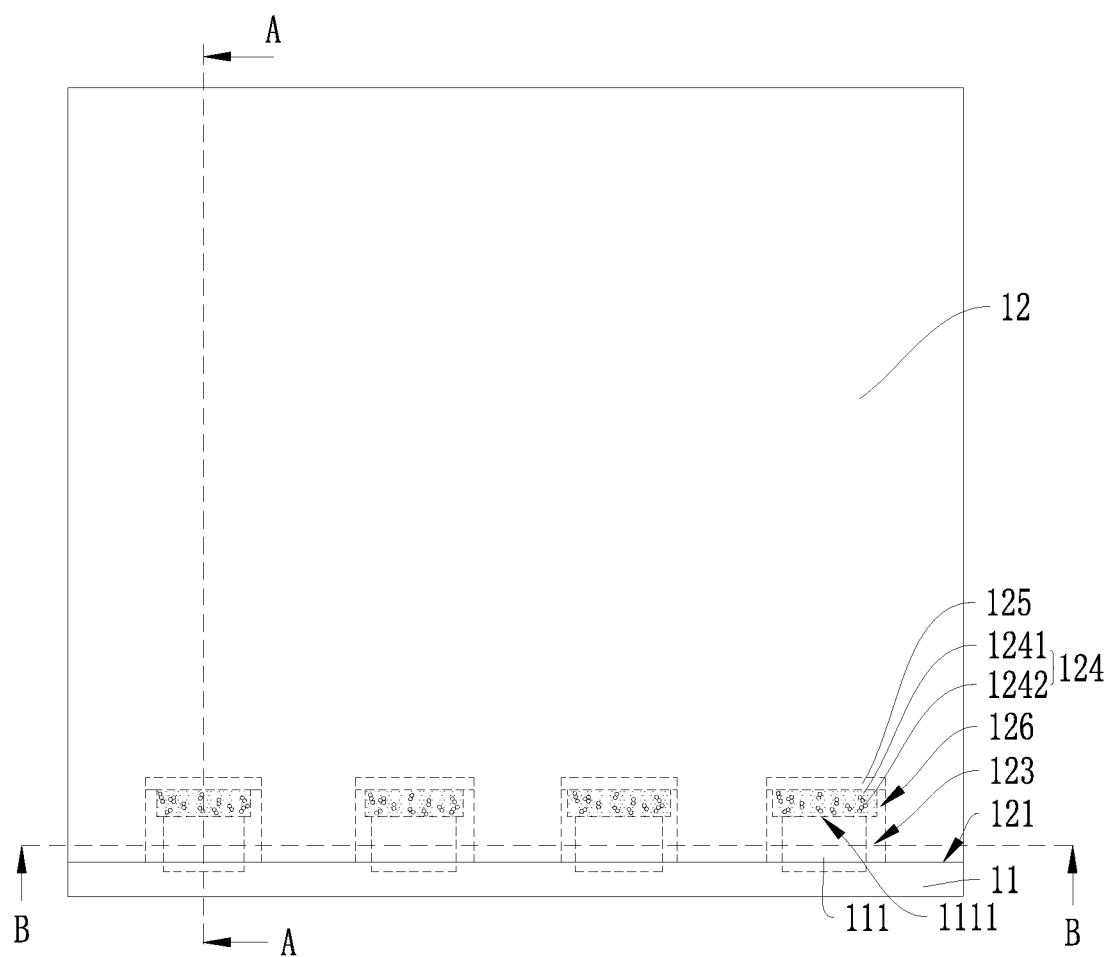
FIG. 1a is a schematic structural diagram of a surface light source according to an embodiment of the disclosure.
Figure 1B:
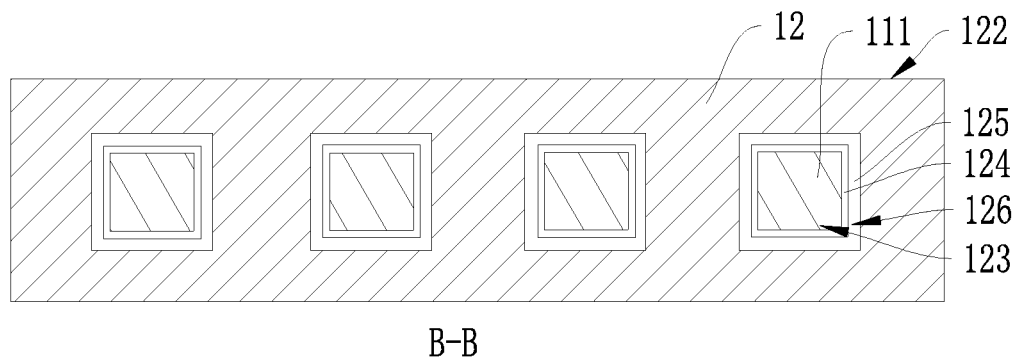
FIG. 1b is a cross-sectional view diagram taken along a line B-B in FIG. 1a according to an embodiment of the disclosure.
Figure 1C:
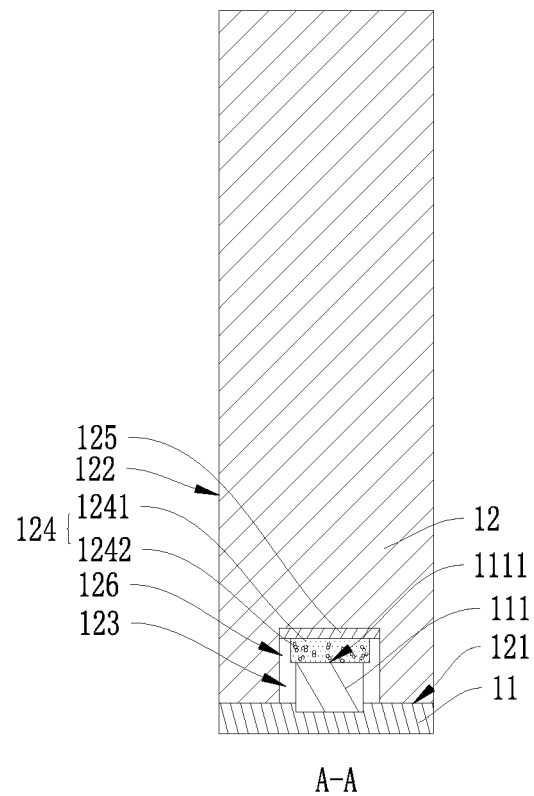
FIG. 1c is a cross-sectional view diagram taken along a line A-A in FIG. 1a according to an embodiment of the disclosure.

FIG. 1a is a schematic structural diagram of a surface light source 10 according to an embodiment of the disclosure. FIG. 1b and FIG. 1c respectively correspond to cross-sectional view diagrams taken along lines B-B and A-A in FIG. 1a.

Specifically, as shown in FIGS. 1a, 1b, and 1c, the surface light source 10 includes a light emitting unit 11 and an optical plate 12. The optical plate 12 has a light input surface 121 and a light output surface 122, and the light input surface 121 and the light output surface 122 are located on two adjacent sides of the optical plate 12 respectively. The side of the optical plate 12 where the light input surface 121 is positioned has grooves 123 arranged thereon and spaced from one another. A quantum layer 124 is arranged in each of the grooves 123 and includes a colloid 1241 and multiple quantum dot nanostructures 1242 dispersed in the colloid 1241. The light emitting unit 11 includes light sources 111 arranged in the grooves 123 respectively, and a light emitting surface 1111 of each of the light sources 111 is close to the quantum layer 124 so that at least a part of light ray emitted from the light source 111 can be striking onto the quantum layer 124.

In addition, it is noted that the surface light source 10 may further include a reflective layer 125 arranged in each of the grooves 123. The Quantum layer 124 is arranged in each of the grooves 123 and positioned on a side of reflective layer 125 facing away the light input surface 122. The quantum layer 124 and a side wall of each of the grooves 123 have a gap 126 existed between. Generally, a width of the gap 126 is in a range of 5-15 microns.

Specifically, the optical plate 12 is made of a glass or plastic material with a diffusion property, such as a polymethacrylate (PMMA), a polystyrene plastic (PS), a polycarbonate (PC) or a polypropylene (PP), and a thickness of the optical plate is generally in a range of 0.3-3 mm. In the embodiment, the groove 123 is a cuboid, but a shape of the groove 123 is not limited thereto in the disclosure, for example, the groove 123 may be one of a cylinder, a cone and a frustum. For example, the colloid 1241 may be made of a material such as one selected from a group consisting of an epoxy resin, a silicone resin, a polycarbonate, a polyvinyl chloride, a polystyrene and a polymethyl methacrylate. The reflective layer 125 is for example made of a material being one or more selected from a group consisting of a light-permeable epoxy resin, a silicone resin, a polyimide resin, an urea-formaldehyde resin and an acrylic resin. A thickness of the reflective layer is generally in a range of 100-300 urn. Each light source 111 may be, for example, a light emitting diode, and may be one of a blue light diode and a violet blue light diode.

Figure 2:
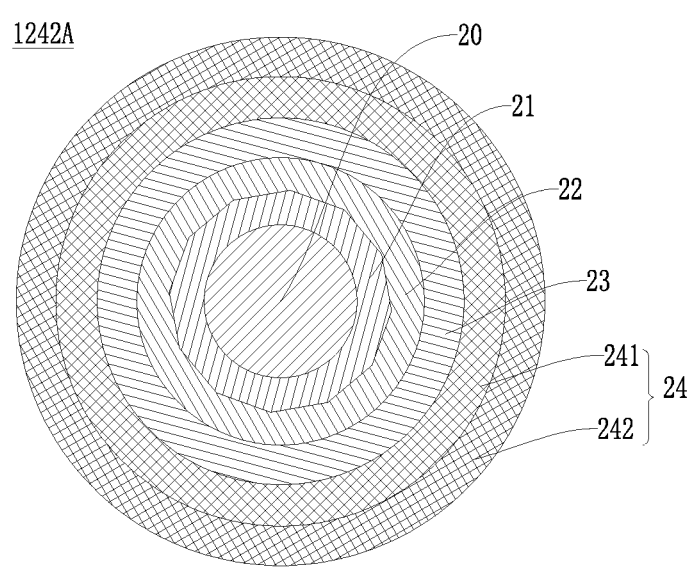
FIG. 2 is a schematic structural diagram of a quantum dot nanostructure according to an embodiment of the disclosure.

A structure of each of the multiple quantum dot nanostructures 1242 in the quantum layer 124 may be, for example, a quantum dot nanostructure 1242A as shown in FIG. 2. Specifically, the quantum dot nanostructure 1242A includes an inner core 20, a ligand layer 21, a hydrophobic layer 22, an encapsulation layer 23, and a barrier layer 24. Where the ligand layer 21 covers the inner core 20. The hydrophobic layer 22 is disposed on a side of the ligand layer 21 facing away the inner core 20. The encapsulation layer 23 is disposed on a side of the hydrophobic layer 22 facing away the ligand layer 21. The barrier layer 24 is disposed on a side of the encapsulation layer 23 facing away the hydrophobic layer 22.

The inner core 20 in the quantum dot nanostructure 1242A is a quantum dot made of a semiconductor material, and may be, for example, one of a II-VI group quantum dot, a III-V group quantum dot, a II-VI group quantum dot having a shell-core structure, a III-V group quantum dot having a shell-core structure, a non-spherical II-VI group quantum dot having an alloy structure, or combinations of any two or more thereof. The II-VI group quantum dot may be, for example, CdSe or CdS. The III-V group quantum dot may be, for example, (Al, In, Ga)P, (Al, In, Ga)As or (Al, In, ga) N. The II-VI group quantum dot having a shell-core structure may be, for example, CdSe or ZnS. The III-V group quantum dot having a shell-core structure may be, for example, The InP or ZnS. The non-spherical II-VI quantum dot with alloy structure may be, for example, ZnCdSeS. It should be noted that the above materials are not intended to limit a type of the inner core 20. As is known for engineers familiar with a synthesis design and manufacturing of a quantum dot light emitting structure, the quantum dot is able to emit light rays of a specific color depending on a different size of the quantum dot, when excited by colored light rays (e.g., blue light rays) of a short wavelength, therefore, a size of the inner core 20 is not limited to a size in a specific range. An appropriate size of the inner core 20 is selected based on a color of light rays emitted from the inner core 20 when excited. For example, when it is required that the color of the light rays emitted from the inner core 20 is blue-green, a size of the inner core should be in a range of 2-7 nm; when it is required that the color is green light, when it is required that the color of the light rays emitted from the inner core 20 is yellow, the size of the inner core should be in a range of 4-12 nm; when it is required that the color of the light rays emitted from the inner core 20 is orange, the size of the inner core should be in a range of 4-14 nm, and when it is required that the color of the light rays emitted from the inner core 20 is red, the size of the inner core should be in a range of 5-20 nm. The ligand layer 21 plays a significant role in modifying a surface of the inner core 20 and regulating a particle size of the inner core 20 since it covers the inner core 20. The ligand layer 21 is usually, for example, made of any material being one of an alkyl phosphine, phosphine oxide, a phosphonic acid, and a carboxylic acid. The alkyl phosphine is, for example, a trioctylphosphine; the phosphine oxide is, for example, a trioctylphosphine oxide; the phosphonic acid is, for example, an octadecylphosphonic acid; and the carboxylic acid is, for example, an oleic acid, dihydrolipoic acid, a lipoic acid, or an acetic acid. Since the material of which the ligand layer 21 is made is hydrophilic, the quantum dot is prone to be eroded by an oxygen and water, at least one hydrophobic material is required to be connect to the ligand layer 21 through a ligand exchange manner such that the hydrophobic layer 22 covers a surface of the ligand layer 21. The hydrophobic layer 22 is made of a silicon-based monomer, such as one of a 3-mercaptopropyltrimethoxysilane (3-MPS), a 3-aminopropyltriethoxysilane (3-Aminopropyl-triethoxysilane (APTMS) or a 3-propylmethacrylate (TMOPMA). The encapsulation layer 23 serves as a barrier for achieving stability of the quantum dot while preventing photo-oxidation of the quantum dot. The encapsulation layer 23 is, for example, made of a tetracthoxysilane (TEOS) or a tetramethyl orthosilicate (TMOS). Through the arranging of the encapsulation layer 23, an intensity of light rays emitted from the quantum dot is reduced, and more importantly, a dispersibility of the quantum dot nanostructure 1242A in a cured polymer material is poor, since the encapsulation layer 23 is prepared from the TEOS or the TMOS, thus the barrier layer 24 is coated on a surface of the encapsulation layer 23. Further, the barrier layer 24 has a multi-layer structure and is made of a silicon or a metal oxide such as one of an alumina, a titanium oxide, a strontium titanate ($SrTiO_3$) and a barium titanate ($BaTiO_3$). The multiple layers of the barrier layer 24 may be made of different materials, and also may be made of a single material repeatedly stacked several times. As shown in FIG. 2, the barrier layer 24 is composed of a two-layer structure including a first barrier layer 241 and a second barrier layer 242. The first barrier layer 241 may be made of a silicon, and the second barrier layer may be made of a metal oxide such as one of an aluminum oxide, a titanium oxide, a strontium titanate ($SrTiO_3$) or a barium titanate ($BaTiO_3$). Of course, the first barrier layer 241 and the second barrier layer 242 may be made of a same material. The quantum dot nanostructure 1242A has a high light color purity, a high luminous quantum efficiency, an adjustable luminous color and a long service life, and the dispersibility of the quantum dot nanostructure 1242 in the colloid 1241 can be enhanced since the barrier layer 24 is arranged in the quantum dot nanostructure 1242, therefore a luminous intensity of the surface light source 10 can be improved.

A method for manufacturing the quantum dot nanostructure 1242A is as follows, including following steps:

(1) 5 milligrams of quantum dots are dispersed in 3 milliliters of nonpolar solution (such as toluene), where each quantum dot includes an inner core 20 and a ligand layer 21;

(2) 0.3 ml of 3-mercaptopropyltrimethoxysilane solution and 0.1 ml of tetramethylammonium hydroxide (TMAH) are added to the nonpolar solution, and are uniformly stirred for 5 minutes at room temperature, as a result, quantum dots with silanization on surfaces thereof are prepared;

(3) 0.1 ml of tetraethoxysilane (TEOS) and 20 ml of methanol are added to a solution obtained in step (2), and a tightness of a packaging structure of the encapsulation layer 23 is controlled by diluting the concentration of the solution;

(4) the step (3) is repeated for 3-5 times;

(5) 0.1 ml of titanium isopropoxide (TTPI) and 20 ml of propanol are added to a solution obtained in the step (4), and a tightness of a coating structure of the barrier layer 24 is controlled by diluting concentration of the solution obtained in the step (4); and (6) the step (5) is repeated for 3-5 times.

Figure 3:
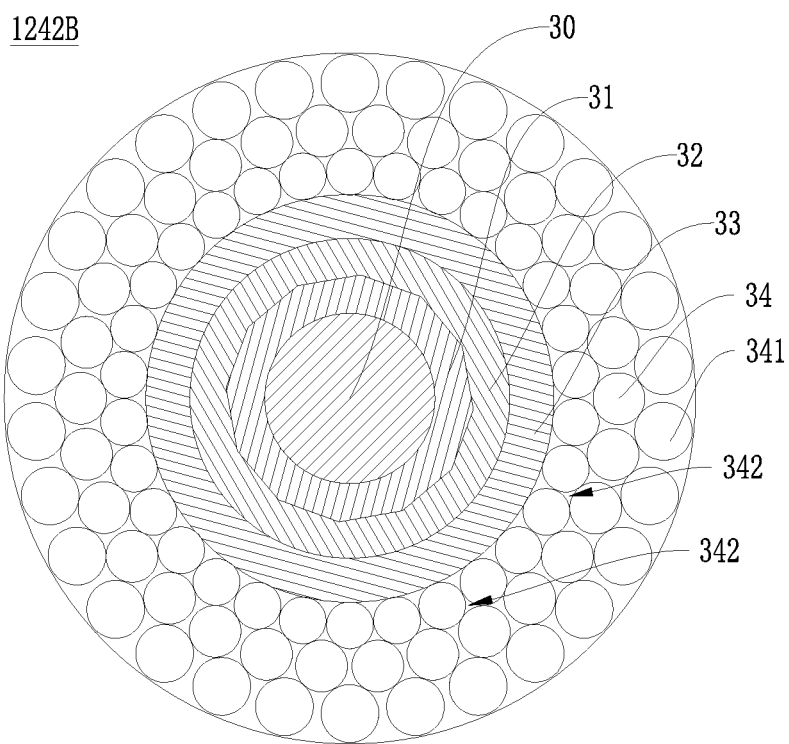
FIG. 3 is a schematic structural diagram of another quantum dot nanostructure according to an embodiment of the disclosure.

In addition, as shown in FIG. 3, an embodiment of the disclosure also provides another structure 1242B of the quantum dot nanostructure 1242 described above. It is noted that the quantum dot nanostructure 1242 of the disclosure is not limited to these two structures 1242A and 1242B, and other suitable structures also can be used.

Specifically, as shown in FIG. 3, the quantum dot nanostructure 1242B includes an inner core 30, a ligand layer 31, a hydrophobic layer 32, an encapsulation layer 33, and a barrier layer 34. Where the ligand layer 31 covers the inner core 30. The hydrophobic layer 32 is disposed on a side of the ligand layer 31 facing away the inner core 30. The encapsulation layer 33 is disposed on a side of the hydrophobic layer 32 facing away the ligand layer 31. And the barrier layer 34 is disposed on a side of the encapsulation layer 33 facing away the hydrophobic layer 32. Materials of the inner core 30, the ligand layer 31, the hydrophobic layer 32 and the encapsulation layer 33 in the quantum dot nanostructure 1242B are the same as those of the inner core 20, the ligand layer 21, the hydrophobic layer 22 and the encapsulation layer 23 in the quantum dot nanostructure 1242A respectively, and will not be repeated here. The barrier layer 34 in the quantum dot nanostructure 1242B includes multiple stacked microsphere structures 341, and is of course not limited to a 3-layered stacked microsphere structure, as shown in FIG. 3. A gap 342 exists between each adjacent two of the multiple stacked microsphere structures and forms a blind hole in the barrier layer 34. The multiple stacked microsphere structures 341 in the barrier layer 34 may be made of a same material, for example, a silicon or a metal oxide, where the metal oxide is, for example, one of an alumina, titanium oxide, a strontium titanate ($SrTiO_3$) and a barium titanate ($BaTiO_3$). Of course, the microsphere structures 341 in the barrier layer 34 may also be made of different materials, for example, in which, there is a microsphere structure made of a silicon, and there is also another microsphere structure made of a metal oxide, where the metal oxide is, for example, one of an aluminum oxide, a titanium oxide, a strontium titanate ($SrTiO_3$) and a barium titanate ($BaTiO_3$). A method of manufacturing the quantum dot nanostructure 1242B proposed in the embodiment may refer to the method of manufacturing the quantum dot nanostructure 1242A described above and will not be repeated here. The quantum dot nanostructure 1242B improves an uniformity of light emission by providing blind holes in the barrier layer 34.

In summary, for the surface light source 10 provided in the embodiment, in a respect, since the grooves 123 are arranged in the optical plate 12 and the quantum layer 124 is arranged in each of the grooves 123, the quantum dot nanostructure 1242 in the quantum layer 124 can emit light of a specific wavelength under the irradiation of a light source, therefore a color gamut level of the surface light source 10 and color expression of a display panel can be improved. In another respect, since the quantum layer 124 is located in the groove 123 of the optical plate 12, a thickness and a volume of the optical plate 12 are not increased, and it is beneficial for thinning and miniaturization design of the optical plate 12. In a further respect, since there is a gap between the quantum layer 124 and each side wall of each of the grooves 123, that is, there is a gas interface between the quantum layer 124 and the optical plate 12, an optical coupling effect between the quantum layer 124 and the optical plate 12 can be improved, and thus a color gamut level of light ray emitted from the optical plate 12 can be significantly improved. In a yet further respect, since the reflective layer 125 is arranged in the groove 123, the quantum layer 124 is arranged on the reflective layer 125, and the blind holes are arranged in the barrier layer of the quantum dot nanostructure, the emitted light can be more uniform.

Finally, it should be noted that the embodiments above are only used to illustrate the technical solutions of the disclosure, but not intended to be limited thereto. Although the disclosure has been described in detail with reference to the above embodiments, the person of ordinary skill in the art should understand that: the technical solutions described in the embodiments may be modified or some of the technical features of the embodiments may be substituted equivalently. However, with these modifications or substitutions, essence of the corresponding technical solutions is not deviated from the spirit and scope of the technical solutions of various embodiments of the disclosure.

What is claimed is:

1. A surface light source, comprising:
   an optical plate, having a light input surface and a light output surface, wherein the light input surface and the light output surface are positioned on two adjacent sides of the optical plate respectively, and the side of the optical plate where the light input surface is positioned has grooves arranged thereon and spaced from one another;
   a reflective layer, disposed in each of the grooves of the optical plate;
   a quantum layer, arranged in each of the grooves of the optical plate and positioned on a side of the reflective layer facing away from the light input surface, wherein the quantum layer and a side wall of each of the grooves have a gap existed therebetween, the quantum layer comprises a colloid and a plurality of quantum dot nanostructures dispersed in the colloid; each of the plurality of quantum dot nanostructures comprises an inner core, a ligand layer, a hydrophobic layer, an encapsulation layer and a barrier layer; the ligand layer covers the inner core, the hydrophobic layer is arranged on a side of the ligand layer facing away from the inner core, the encapsulation layer is arranged on a side of the hydrophobic layer facing away from the ligand layer, and the barrier layer comprises a plurality of stacked microsphere structures arranged on a side of the encapsulation layer facing away from the hydrophobic layer; and
   a light emitting unit, comprising light sources, wherein the light sources are arranged in the grooves respectively, and a light emitting surface of each of the light sources is close to the quantum layer so that at least a part of light rays emitted from the light source is capable of striking onto the quantum layer.

2. A surface light source comprising a light emitting unit and an optical plate, wherein the optical plate comprises a light input surface and a light output surface, the light input surface and the light output surface are positioned on two adjacent sides of the optical plate respectively, and the side of the optical plate where the light input surface is positioned has grooves arranged thereon and spaced from one another;
   wherein a quantum layer is arranged in each of the grooves, the quantum layer comprises a colloid and a plurality of quantum dot nanostructures dispersed in the colloid; each of the plurality of quantum dot nanostructures comprises an inner core, a ligand layer, a hydrophobic layer, an encapsulation layer and a barrier layer; the ligand layer covers the inner core, the hydrophobic layer is arranged on a side of the ligand layer facing away from the inner core, the encapsulation layer is arranged on a side of the hydrophobic layer facing away from the ligand layer, and the barrier layer is arranged on a side of the encapsulation layer facing away from the hydrophobic layer;
   wherein the light emitting unit comprises light sources, the light sources are arranged in the grooves respectively, and a light emitting surface of each of the light sources is close to the quantum layer so that at least a part of light rays emitted from the light source is capable of striking onto the quantum layer.

3. The surface light source according to claim 2, further comprising: a reflective layer disposed in each of the grooves; wherein the quantum layer is arranged in each of the grooves and positioned on a side of the reflective layer facing away from the light input surface.

4. The surface light source according to claim 2, wherein the quantum layer and a side wall of each of the grooves has a gap existed therebetween.

5. The surface light source according to claim 2, wherein each of the light sources is a light emitting diode.

6. The surface light source according to claim 2, wherein the colloid is made of a material being one selected from a group consisting of an epoxy resin, a silicone resin, a polycarbonate, a polyvinyl chloride, a polystyrene and a polymethyl methacrylate.

7. The surface light source according to claim 4, wherein a width of the gap is in a range of 5-15 microns.

8. The surface light source according to claim 2, wherein the barrier layer comprises a plurality of stacked microsphere structures, and a gap exists between each adjacent two of the plurality of stacked microsphere structures and forms a blind hole of the barrier layer.

9. The surface light source according to claim 8, wherein the barrier layer is made of a material being one of a silicon and a metal oxide; and the metal oxide is one of an aluminum oxide, a titanium oxide, a strontium titanate and a barium titanate.

10. The surface light source according to claim 2, wherein the inner core is made of a material being one of a II-VI group quantum dot, a III-V group quantum dot, a II-VI group quantum dot having a shell-core structure, a III-V group quantum dot having a shell-core structure, a non-spherical II-VI group quantum dot having an alloy structure, and combinations of any two or more thereof.

* * * * *